(12) United States Patent
Lee et al.

(10) Patent No.: US 6,849,536 B2
(45) Date of Patent: Feb. 1, 2005

(54) INTER-METAL DIELECTRIC PATTERNS AND METHOD OF FORMING THE SAME

(75) Inventors: Soo-Geun Lee, Suwon (KR); Ju-Hyuk Chung, Suwon (KR); Il-Goo Kim, Seongnam (KR); Kyoung-Woo Lee, Seoul (KR); Wan-Jae Park, Suwon (KR); Jae-Hak Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 24 days.

(21) Appl. No.: 10/404,210

(22) Filed: Apr. 1, 2003

(65) Prior Publication Data

US 2003/0186538 A1 Oct. 2, 2003

(30) Foreign Application Priority Data

Apr. 2, 2002 (KR) ............................. 10-2002-0017949

(51) Int. Cl.⁷ .......................................... H01L 21/4762
(52) U.S. Cl. ..................... 438/622; 438/637; 438/702; 257/758; 257/760
(58) Field of Search ................................ 438/622, 637, 438/645, 639, 624, 700, 702; 257/758, 760

(56) References Cited

U.S. PATENT DOCUMENTS 6,528,428 B1 * 3/2003 Chen et al. ................. 438/700
2003/0139034 A1 * 7/2003 Yuang ........................ 438/634

FOREIGN PATENT DOCUMENTS

KR 01-0001960 1/2001 .......... H01L/21/28

* cited by examiner

Primary Examiner—Caridad Everhart
(74) Attorney, Agent, or Firm—Mills & Onello, LLP

(57) ABSTRACT

Provided are an inter-metal dielectric pattern and a method of forming the same. The pattern includes a lower interconnection disposed on a semiconductor substrate, a lower dielectric layer having a via hole exposing the lower interconnection and covering the semiconductor substrate where the lower interconnection is disposed, and an upper dielectric pattern and a lower capping pattern, which include a trench line exposing the via hole and sequentially stacked on the lower dielectric layer. The lower dielectric layer and the upper dielectric pattern are low k-dielectric layers formed of materials such as $SiO_2$, SiOF, SiOC, and porous dielectric. The method includes forming an inter-metal dielectric layer including a lower dielectric layer and upper dielectric layer, which are sequentially stacked, on a lower interconnection formed on a semiconductor substrate. The inter-metal dielectric layer is patterned to form a via hole, which exposes the upper side of the lower interconnection. Then, an upper capping layer is formed on the entire surface of the semiconductor substrate including the via hole. The upper capping layer and the upper dielectric layer are successively patterned to form a trench line exposing the upper side of the via hole. The upper capping layer is formed of at least one material selected from the group consisting of a silicon oxide layer, a silicon carbide layer, a silicon nitride layer, and a silicon oxynitride layer, by using PECVD.

28 Claims, 12 Drawing Sheets

INTER-METAL DIELECTRIC PATTERNS AND METHOD OF FORMING THE SAME

FIELD OF THE INVENTION

The present invention relates to semiconductor devices and methods of forming the same. More particularly, the invention relates to inter-metal dielectric patterns of a semiconductor device and to a method of forming the same.

BACKGROUND OF THE INVENTION

In general, aluminum and silicon oxide have been widely used for interconnections of semiconductor devices and inter-metal dielectrics (IMDs), respectively.

To achieve high speed and high integration of semiconductor devices, recently there has been great progress in the study of copper, which exhibits a lower electric resistance than aluminum, and low k-dielectric, which has a lower dielectric constant than the silicon oxide.

Copper exhibits electric resistance of $1.70 \times 10^{-6}$ $\Omega$cm, which is lower than aluminum, which exhibits electric resistance of $2.74 \times 10^{-6}$ $\Omega$cm. Also, copper has attracted attention as a material that may solve electromigration (EM) suffered by aluminum. However, copper formerly could not be used in existing vapor deposition and dry etching processes. But now, it has become possible to utilize copper for interconnections of semiconductor devices through recently proposed electroplating and dual damascene processes.

Use of the low k-dielectric layer may minimize an increase in RC delay times and cross-talk characteristics, which are caused by a reduction in distance between interconnections due to the high integration of semiconductor devices. Thus, a material such as SiOC, SOG, or porous dielectric, of which the dielectric constant (3.0 or less) is lower than that (3.9 to 4.2) of the silicon oxide layer, have been discussed for the low k-dielectric layer.

FIGS. 1A through 1C are cross-sectional views illustrating the conventional dual damascene method using the low k-dielectric layer for an inter-metal dielectric layer. The conventional dual damascene process is commonly called a "Via first approach technique."

Referring to FIG. 1A, a lower interconnection 15 is formed on a semiconductor substrate. A lower etch stop layer 20, a lower dielectric layer 25, an upper etch stop layer 30, and an upper dielectric layer 35 are sequentially stacked on the entire surface of the semiconductor substrate including the lower interconnection 15. The upper dielectric layer 35, the upper etch stop layer 30, and the lower dielectric layer 25 are successively patterned to form a via hole 40, which exposes the upper side of the lower etch stop layer 20. Here, as described above, the upper and lower dielectric layers 35 and 25 are formed of low k-dielectric layers such as SiOC, SOG, and porous dielectric.

Referring to FIG. 1B, photoresist is formed to fill the via hole 40 on the entire surface of the semiconductor substrate where the via hole 40 is formed. The photoresist is exposed and developed to form a photoresist pattern 50, which will serve as a mask during a subsequent process of patterning the upper dielectric layer 35. For this, the photoresist pattern 50 crosses over the via hole, exposing the upper dielectric layer 35.

During the exposure process, the photoresist, which contacts the upper and lower dielectric layers 35 and 25, causes an abnormal reaction. That is, the photoresist residue 99, which is not removed by the development process, is formed. As a result, the photoresist residue 99 covers the inner wall of the via hole 40 and occasionally covers the upper side of the upper dielectric layer 35 around the via hole.

The abnormal reaction results from reaction of basic materials included in the upper and lower dielectric layers 35 and 25 formed of low k-dielectric layers with hydrogen ions produced from the exposure process. The basic materials are produced as a result of penetration of nitrogen atoms used during processes of forming the via hole 40, removing the photoresist, and cleaning, into the upper and lower dielectric layers 35 and 25. Also, the hydrogen ions are generated during an ultraviolet photolithographic process (in more detail, an exposure process) for controlling the development process by using photo-generating acid. The ultraviolet photolithographic process is typically used for highly integrated semiconductor devices requiring the low k-dielectric layers.

Referring to FIG. 1C, an anisotropic etching process is carried out using the photoresist pattern 50 as an etch mask, thereby etching the upper dielectric layer 35 and the upper etch stop layer 30. Thus, an upper dielectric pattern 36 and an upper etch stop pattern 31 are formed to expose the upper side of the lower dielectric layer 25. Here, even though it is preferable to expose a top surface of the lower interconnection 15, the lower interconnection 15 is not exposed due to the photoresist residue 99, which serves as an etch stop layer.

As illustrated in FIG. 1B, the photoresist residue 99 covers the upper side of the upper dielectric layer 35 around the via hole 40. As a result, the upper insulation spacer 37 may remain on the upper etch stop layer 30 around the via hole 40, even after the process of forming the upper dielectric pattern 36. The photoresist residue 99 and the upper insulation spacer 37 may cause the lower interconnection 15 to be opened.

FIGS. 2A and 2B are cross-sectional views illustrating another problem of the conventional dual damascene process. In general, a single upper interconnection is connected with a plurality of via holes 40, which may be spaced apart from each other by a narrow interval. FIGS. 2A and 2B illustrate cross-sections of a narrow region between the via holes. Steps of FIGS. 2A and 2B are the same as those of FIGS. 1A through 1C. A description of the same steps will be omitted here to avoid redundancy.

Referring to FIGS. 2A and 2B, when the via hole 40 is formed as illustrated in FIG. 1A, the upper edge of the upper dielectric layer 35 may be rounded. Such a problem occurs because the via hole 40, which penetrates the upper dielectric layer 35, the upper etch stop layer 30, and the lower dielectric layer 25, is deep. To undergo a stable photolithographic process, another photoresist pattern (not shown) for forming the via hole 40 has a predetermined thickness. As a result, another photoresist pattern is worn out during the etching process for forming the deep via hole 40 so as to both cause the edge of the upper dielectric layer 35 to be rounded (or recessed), and allow the inner wall of the via hole 40 to be slanted, as illustrated in FIGS. 2A and 2B. The round shape of the upper dielectric layer 35 is transferred to the upper edge of the lower dielectric layer 25 during the etching process for forming the upper dielectric pattern 36. Thus, the upper side of the lower dielectric layer 25 is recessed between the adjacent via holes, thus becoming reduced in thickness as shown at 88, such that the height of the top surface is reduced. Such a problem (88) causes a subsequent process of forming an upper interconnection (not shown) to be unstable.

Furthermore, according to the conventional method, the thickness of the upper dielectric layer 30 is formed in consideration of the recess formed during a subsequent planarizing etch process for forming the upper interconnection. However, in the case that the upper dielectric layer 35 is thickly formed in consideration of the recess, when the photolithographic process for forming the via hole 40 is carried out, the photoresist layer should be thicker to minimize the problems caused by the consumption of the photoresist. However, if the photoresist becomes thick, the photolithographic process becomes difficult, as described above.

SUMMARY OF THE INVENTION

Accordingly, the present invention provides a method of forming an inter-metal dielectric pattern, which prevents the photoresist residue from forming in the via.

The present invention also provides a method of forming an inter-metal dielectric pattern, which may reduce the thickness of a photoresist layer stacked during a via hole patterning process.

The present invention further provides an inter-metal dielectric pattern, which may prevent disconnection between interconnections formed on other layers.

In accordance with an aspect of the present invention, there is provided a method of forming an inter-metal dielectric pattern comprising forming an inter-metal dielectric pattern that can prevent an abnormal reaction of photoresist formed to form a trench line. The method includes forming an inter-metal dielectric layer on a lower interconnection formed on a semiconductor substrate. Here, the inter-metal dielectric layer includes a lower dielectric layer and an upper dielectric layer, which are sequentially stacked. The inter-metal dielectric layer is patterned to form a via hole, which exposes the upper side of the lower interconnection. Then, an upper capping layer is formed on the entire surface of the semiconductor substrate including the via hole. The upper capping layer and the upper dielectric layer are successively patterned to form a trench line exposing the upper side of the via hole.

Preferably, the lower and upper dielectric layers are respectively formed of at least one material selected from the group consisting of $SiO_2$, SiOF, SiOC, and porous dielectric. But, the lower and upper dielectric layers may not be formed of the identical material.

Forming the inter-metal dielectric layer further comprises forming a lower capping layer on the upper dielectric layer. Each of the upper and lower capping layers are preferably formed of at least one material selected from the group consisting of a silicon oxide layer, a silicon carbide layer, a silicon nitride layer, and a silicon oxynitride layer. But, the upper and lower capping layers may not be formed of the identical material. Here, the upper capping layer is preferably formed using at least one of plasma enhanced chemical vapor deposition (PECVD), high-density plasma (HDP), and atomic layer deposition (ALD).

To form the trench line, a photoresist layer is formed on the upper capping layer. A photolithographic process is then applied to the photoresist layer to form a photoresist pattern. The upper capping layer and the upper dielectric layer are successively etched using the photoresist pattern as an etch mask, thereby forming an upper capping pattern and an upper dielectric pattern. Then, the photoresist pattern is removed. Here, the photolithographic process comprises an exposure process using ultraviolet. While the etch process for forming the upper dielectric pattern is carried out, the upper capping spacer is formed.

The via hole is formed using an anisotropic etching process, which adopts an etch recipe by which can be selectively etched with respect to the lower interconnection. However, as another embodiment, it is possible to further form a lower etch stop layer on the lower interconnection, before forming the lower dielectric layer. In this case, the via hole is preferably formed using an etch recipe that can be selectively etched with respect to the lower etch stop layer. In the case of the embodiment, forming the trench line preferably comprises successively etching the upper capping pattern and the upper dielectric layer by using an etch recipe that can be selectively etched with respect to the lower etch stop layer, and then etching the lower etch stop layer by using an etch recipe that can be selectively etched with respect to the lower interconnection.

Before forming the upper dielectric layer, an upper etch stop layer may be further formed on the lower dielectric layer. The lower and upper etch stop layers are preferably formed of SiC layers.

In accordance with another aspect of the present invention, there is provided an inter-metal dielectric pattern that can prevent disconnection in a via hole. The pattern includes a lower interconnection disposed on a semiconductor substrate, a lower dielectric layer having a via hole exposing the lower interconnection and covering the semiconductor substrate where the lower interconnection is disposed, and an upper dielectric pattern and a lower capping pattern, which include a trench line exposing the via hole and sequentially stacked on the lower dielectric layer.

The lower dielectric layer and the upper dielectric pattern are formed of low k-dielectric layers. Preferably, the lower dielectric layer and the upper dielectric pattern are formed of at least one material selected from the group consisting of $SiO_2$, SiOF, SiOC, and porous dielectric. However, the lower dielectric layer and the upper dielectric pattern may not be formed of the identical material.

Also, an upper capping spacer may be further disposed on the inner wall of the via hole.

Each of the lower capping pattern and the upper capping spacer is preferably formed of at least one material selected from the group consisting of a silicon oxide layer, a silicon carbide layer, a silicon nitride layer, and a silicon oxynitride layer.

A lower etch stop layer is further disposed between the lower dielectric layer and the lower interconnection, and an upper etch stop pattern is further disposed between the upper dielectric pattern and the lower dielectric pattern. The lower etch stop pattern and the upper etch stop pattern are preferably SiC layers.

DESCRIPTION OF THE PREFERRED EMBODIMENT

Figure 1A:
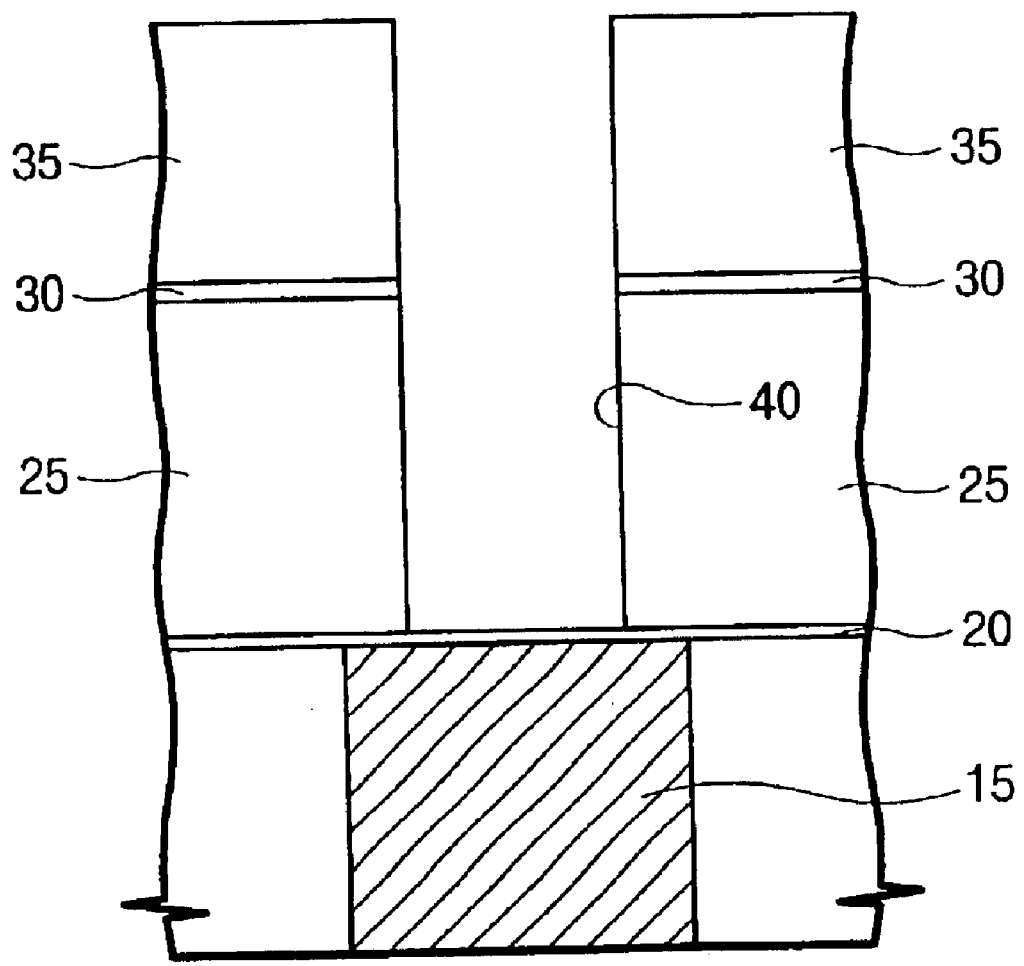
FIGS. 1A through 1C are cross-sectional views illustrating a drawback of the conventional method of forming an inter-metal dielectric pattern.
Figure 1B:
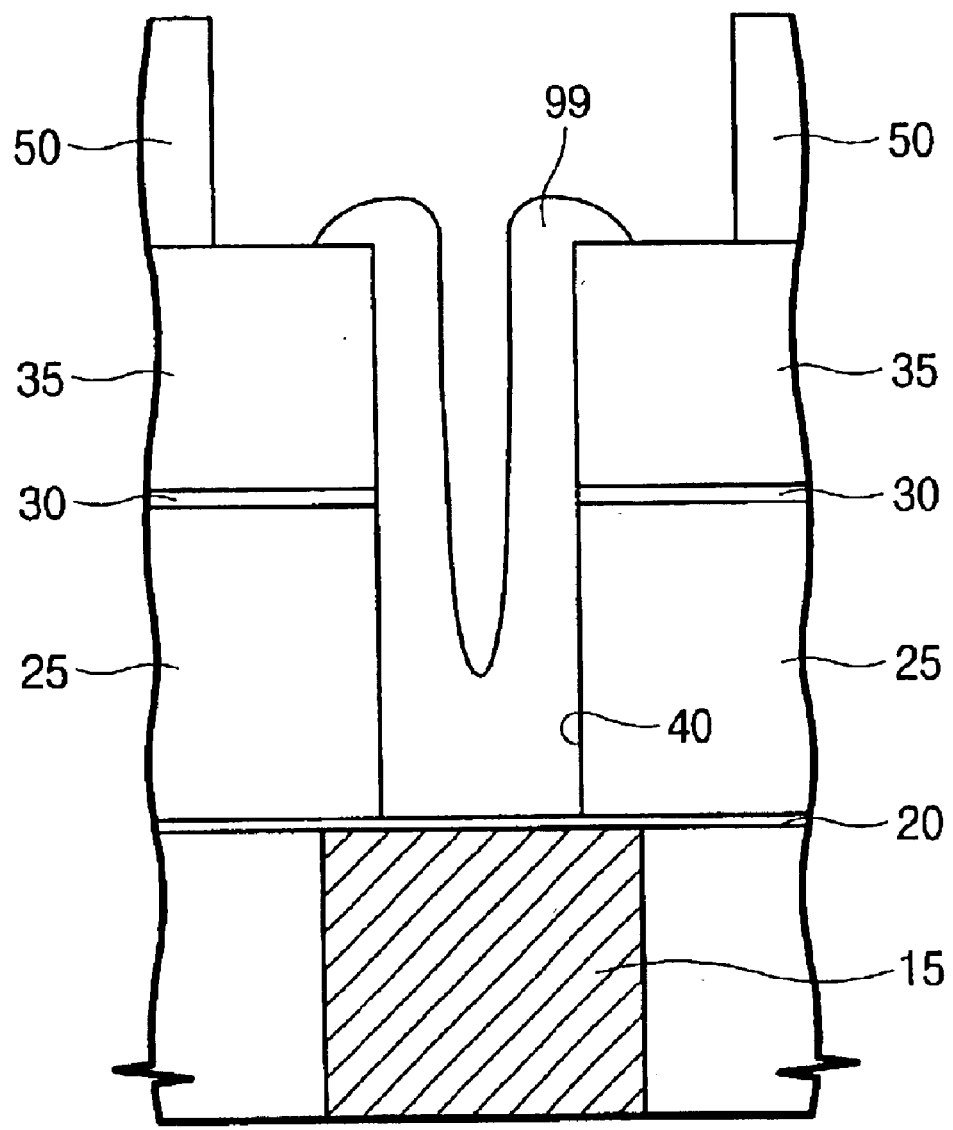
Figure 1C:
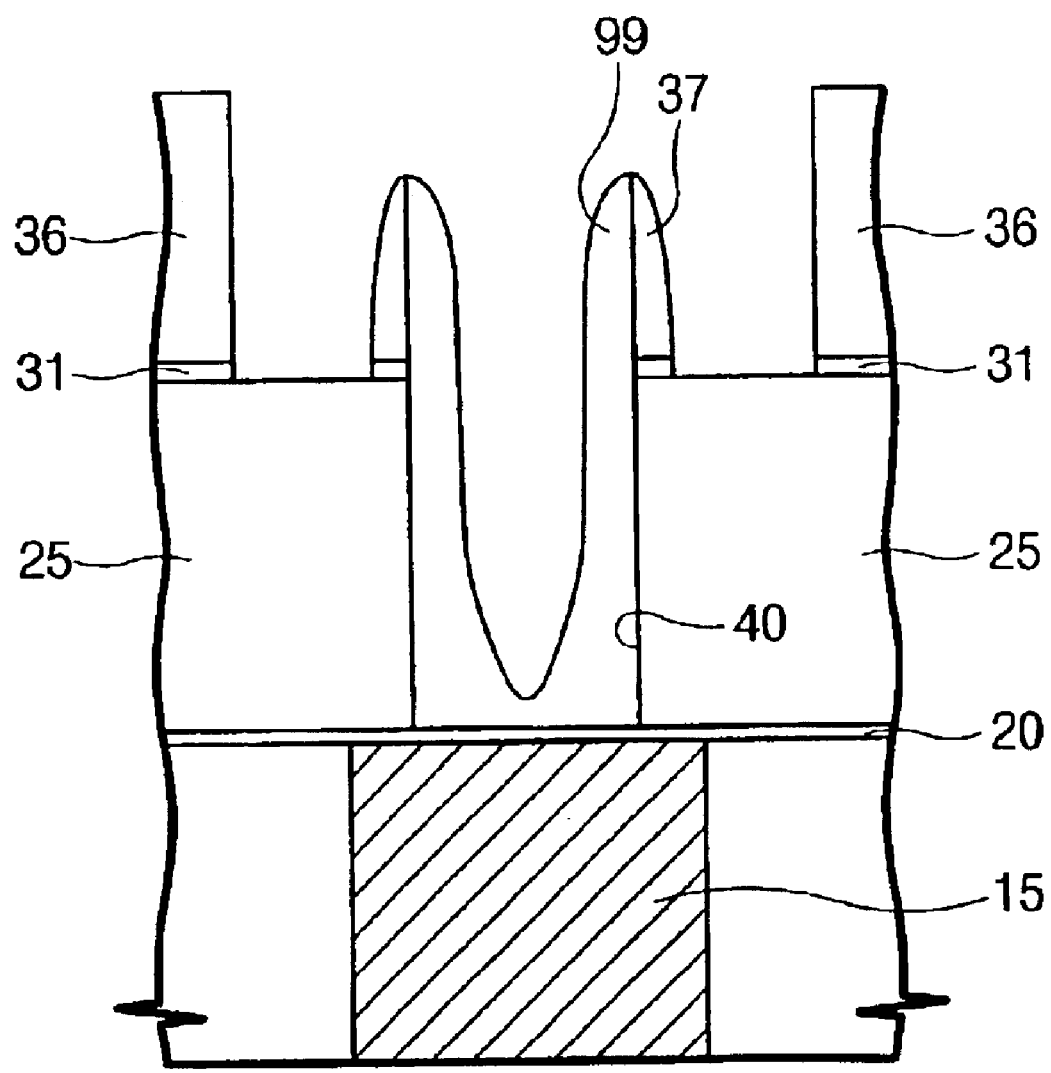
Figure 2A:
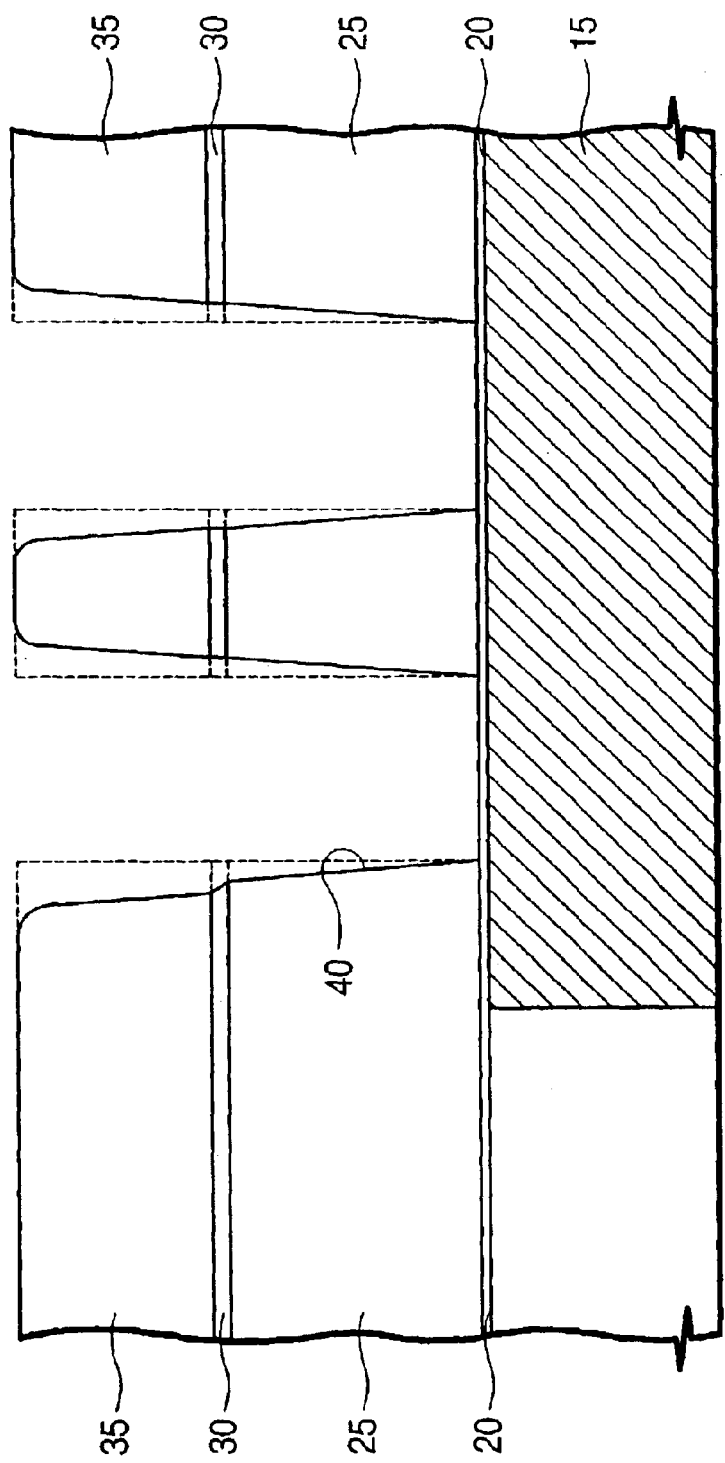
FIGS. 2A and 2B are cross-sectional views illustrating another drawback of the conventional method of forming the inter-metal dielectric pattern.
Figure 2B:
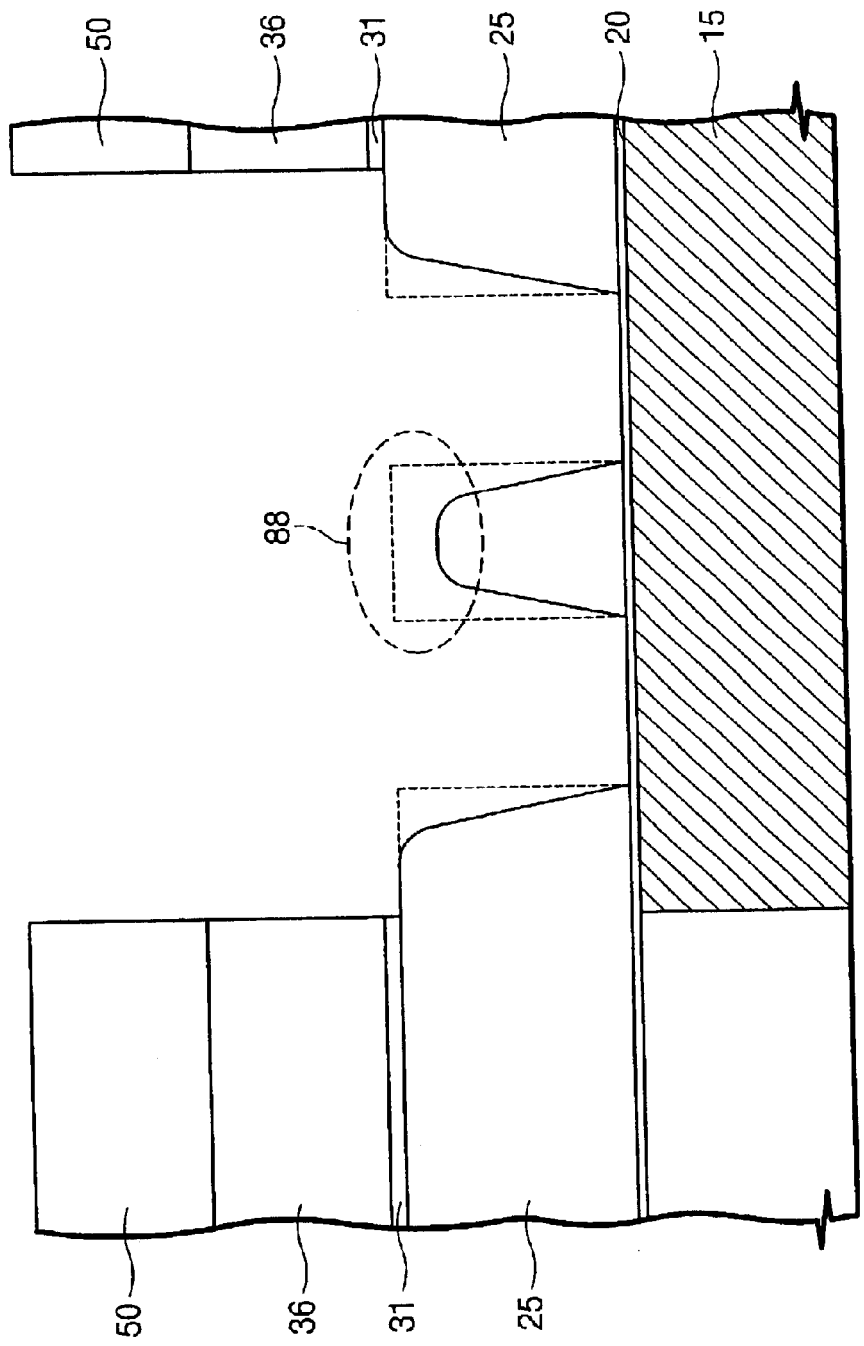

The present invention will now be described more fully hereinafter with reference to the accompanying drawings, in which preferred embodiments of the invention are shown. The invention may, however, be embodied in different forms and should not be construed as limited to the embodiments set forth herein. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

FIGS. 3A through 3F are cross-sectional views illustrating a dual damascene method according to a preferred embodiment of the present invention.

Figure 3A:
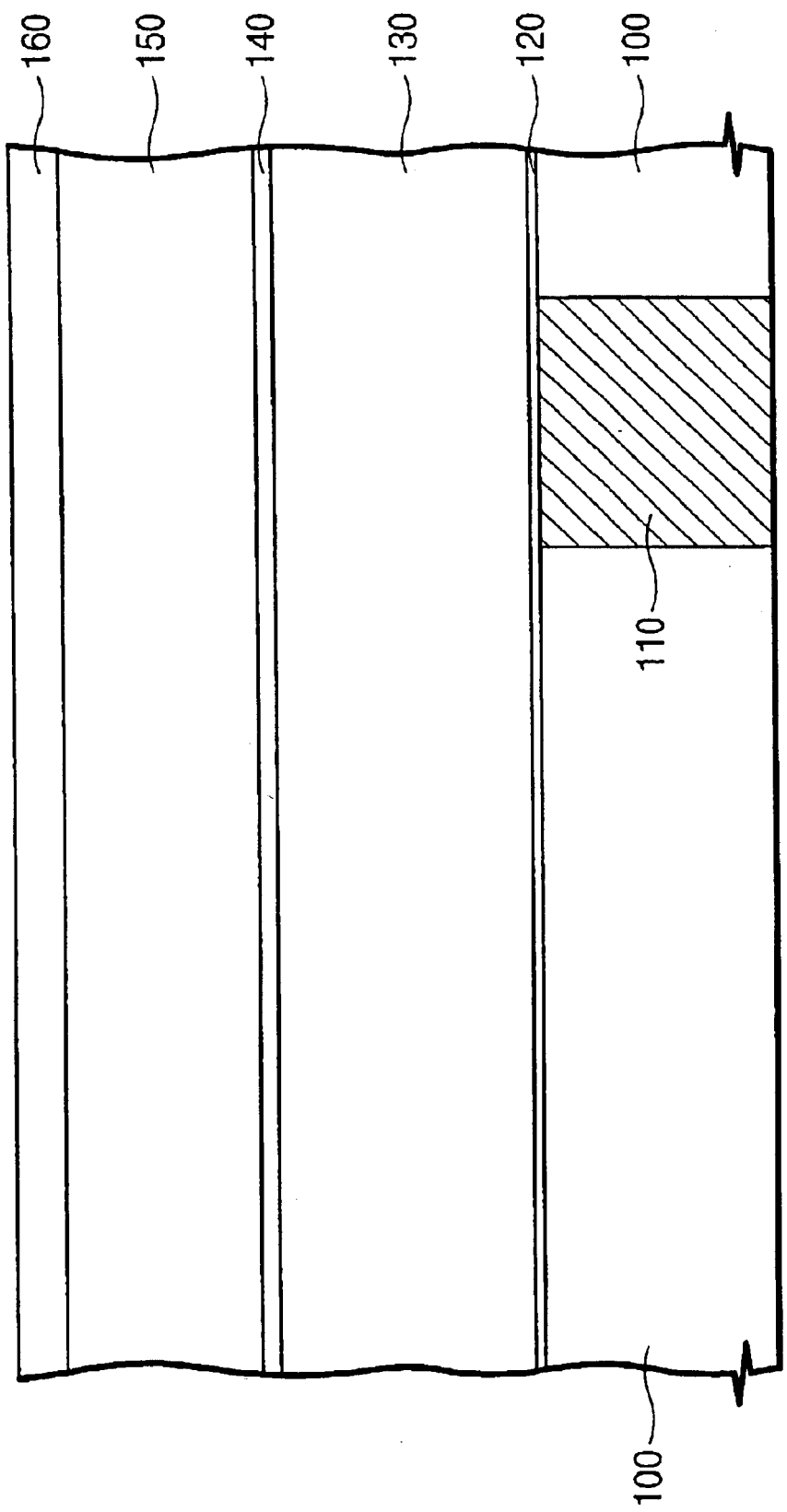
FIGS. 3A through 3F are cross-sectional views illustrating a dual damascene method according to preferred embodiments of the present invention.

Referring to FIG. 3A, a lower interconnection 110, whose sidewalls are surrounded by an interlayer dielectric (ILD) 100, is formed on a semiconductor substrate. The lower interconnection 110 connects with each electrode of devices such as a transistor, a resistor, and a capacitor formed on the semiconductor substrate. Here, to achieve high speed of semiconductor devices, the lower interconnection 110 is preferably formed of a metal layer such as copper or aluminum.

The ILD 100 is formed using an ordinary method. Occasionally, the ILD 110 may be obtained from the damascene process for forming the lower interconnection 110. Here, the ILD 100 is preferably formed of one of a typical silicon oxide layer and a low k-dielectric layer.

A lower etch stop layer 120, a lower dielectric layer 130, an upper etch stop layer 140, an upper dielectric layer 150, and a lower capping layer 160 are sequentially stacked on the entire surface of the semiconductor substrate including the lower interconnection 110.

The lower dielectric layer 130 and the upper dielectric layer 150 are respectively formed of at least one material selected from the group consisting of SiOC, SOG, and porous dielectric. In this case, the lower and upper dielectric layers 130 and 150 may not be formed of the identical material. The lower dielectric layer 130 is formed to a thickness of 2000 Å to 5000 Å, and the upper dielectric layer 150 is formed to a thickness of 2000 Å to 8000 Å.

The lower capping layer 160 is a material layer for preventing the abnormal reaction described in Background of the Invention between photoresist and the upper dielectric layer 150, during a subsequent patterning process for forming a via hole. Thus, the lower capping layer 160 is formed of at least one material selected from the group consisting of a silicon oxide ($SiO_2$) layer, a silicon carbide (SiC) layer, a silicon nitride (SiN) layer, and a silicon oxynitride (SiOC) layer. The lower capping layer 160 is formed to the thickness of about 200 Å, using a material selected from the group consisting of PECVD, HDP, and ALD. The lower capping layer 160 is a material layer that can minimize the above-described problem caused by an increase in the thickness of the photoresist, and whose function will be described in detail later with reference to FIG. 3F.

The lower and upper etch stop layers 120 and 140 are formed of a material layer which can be selectively etched with respect to the lower and upper dielectric layers 130 and 150, respectively. Preferably, the lower and upper etch stop layers 120 and 140 are formed of a material selected from the group consisting of a silicon carbide (SiC) layer, a silicon oxide ($SiO_2$), a silicon nitride (SiN), and a silicon oxynitride (SiON) layer. Similarly, the lower and upper etch stop layers 120 and 140 may not be formed of the identical material.

Figure 3B:
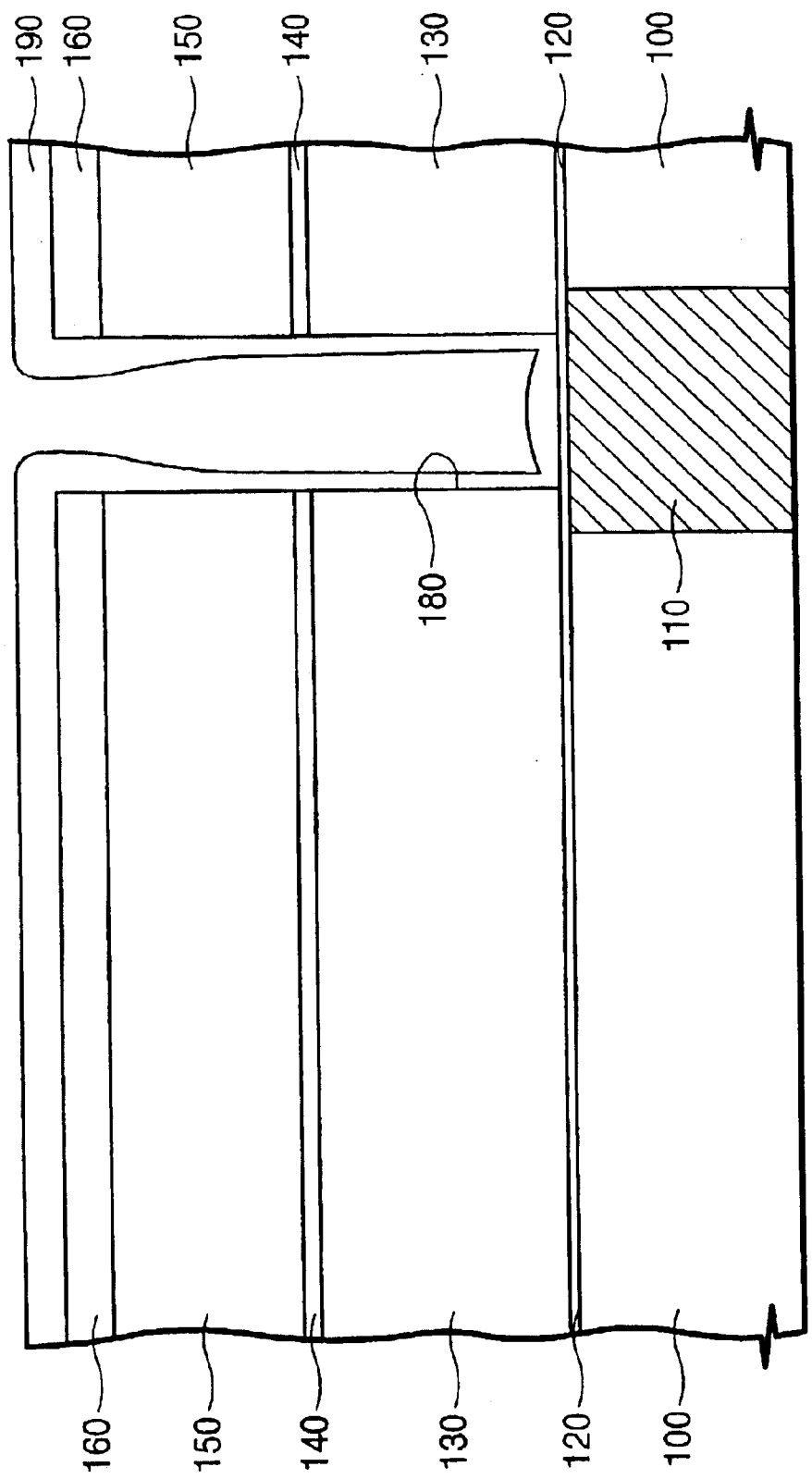

Referring to FIG. 3B, a first photoresist layer is formed on the lower capping layer 160. The first photoresist layer is exposed and developed to form a first photoresist pattern (not shown) that defines a position of a via hole to be formed during a subsequent process. Here, the first photoresist layer is formed of photoresist for DUV, and the exposure process for forming the first photoresist pattern preferably uses ultraviolet rays.

The upper dielectric layer 150 may include a basic material. However, the lower capping layer 160 prevents the basic material included in the upper dielectric layer 150 from abnormally reacting with photo-generating acid, which is formed during the ultraviolet exposure process for forming the first photoresist pattern.

The inter-metal dielectric is anisotropically etched using the first photoresist pattern as an etch mask, to form a via hole 180, which exposes the lower etch stop layer 120. Thus, the inner wall of the lower capping layer 160, the upper dielectric layer 150, the upper etch stop layer 140, and the lower dielectric layer 130 are exposed. Thereafter, the first photoresist pattern is removed.

Meanwhile, the anisotropic etching process for forming the via hole 180 is preferably carried out using plasma containing nitrogen. But, the nitrogen atoms may create a basic material that is diffused through sidewalls of the upper and lower dielectric layers 150 and 130. The basic material may be formed not only by the anisotropic etching process for forming the via hole 180, but also by the removal process of the first photoresist pattern or the cleaning process.

An upper capping layer 190 is formed on the entire surface of the semiconductor substrate where the via hole 180 is formed. The upper capping layer 190 is formed of at least one material selected from the group consisting of a silicon oxide layer, a silicon carbide layer, a silicon nitride layer, and a silicon oxynitride layer. Here, the nitrogen atoms constituting the silicon nitride layer and the silicon oxynitride layer are in a stable inactivation state, unlike the nitrogen resulting in formation of the basic material.

The upper capping layer 190 is formed to have poor step coverage, as illustrated in FIG. 3B, by using PECVD. Thus, during a subsequent process of forming a trench line, the conventional problem that the edge of the upper dielectric layer 150 surrounding the via hole 180 is rounded may be minimized. This will be described more fully later with reference to FIG. 3D. In addition to PECVD, the upper capping layer 190 may be formed using one of HDP and ALD. Furthermore, the upper capping layer 190 may be formed of FSG by HDP. The upper capping layer 190 is preferably formed to a thickness of 200 Å to 2000 Å.

Figure 3C:
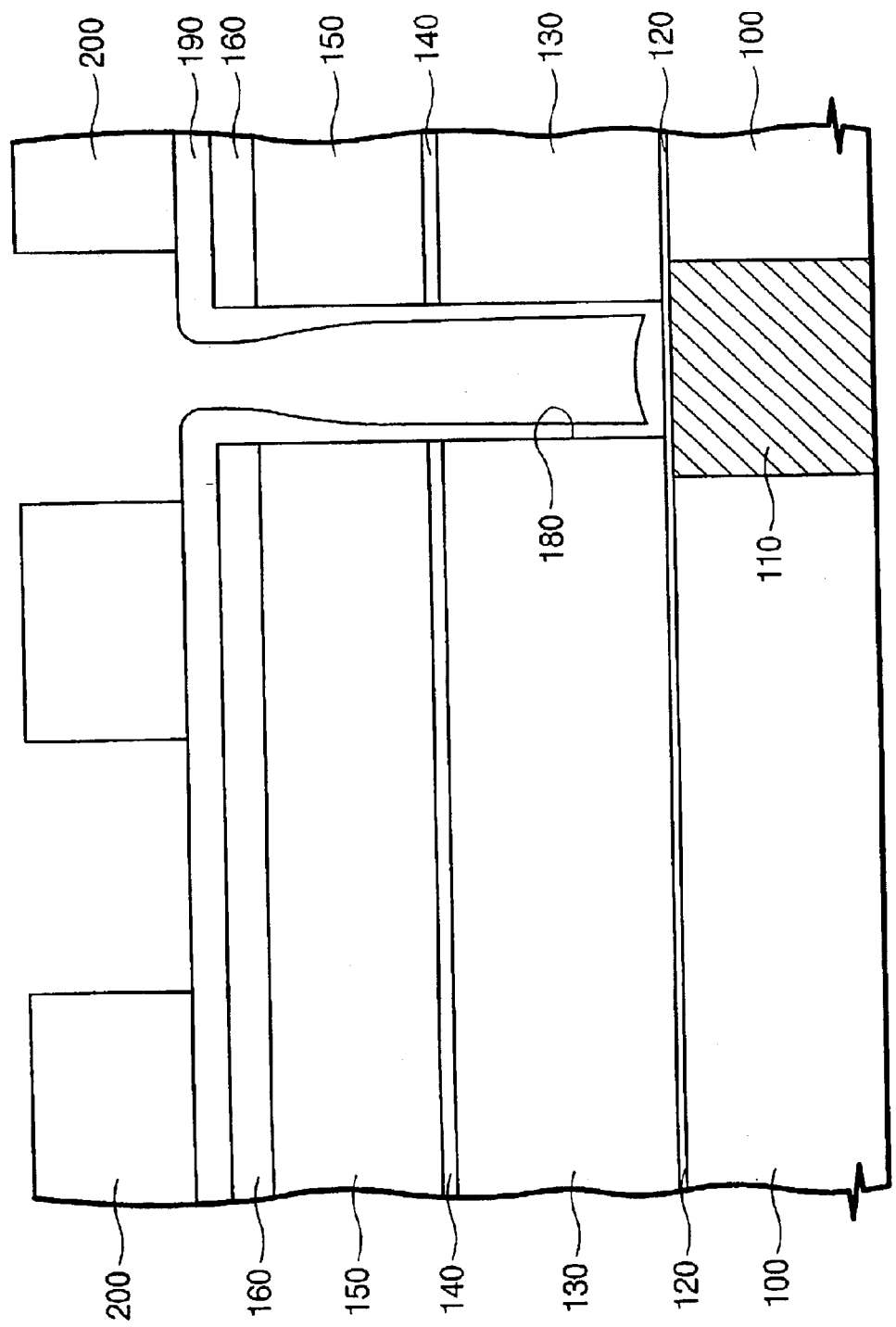

Referring to FIG. 3C, a second photoresist layer is formed on the upper capping layer 190. The second photoresist layer fills the via hole 180 covered by the upper capping layer 190. The second photoresist layer is exposed and developed to form a second photoresist pattern 200. Preferably, the second photoresist pattern 200 crosses over the via hole 180 and is formed to have an opening pattern wider than an opening of the via hole 180. The opening pattern of the second photoresist pattern 200 is used to define a trench line to be formed during a subsequent process.

In this case, the second photoresist layer is formed of photoresist for DUV, and the exposure process for forming the second photoresist pattern 200 preferably uses ultraviolet rays. The ultraviolet exposure process creates photo-generating acid.

As described above, the upper and lower dielectric layers 130 may include basic materials. But, the upper capping layer 190 prevents the basic materials from abnormally reacting with the photo-generating acid. As a result, the photoresist is completely removed from the inside of the via hole by the development process, without any photoresist residue remaining.

Figure 3D:
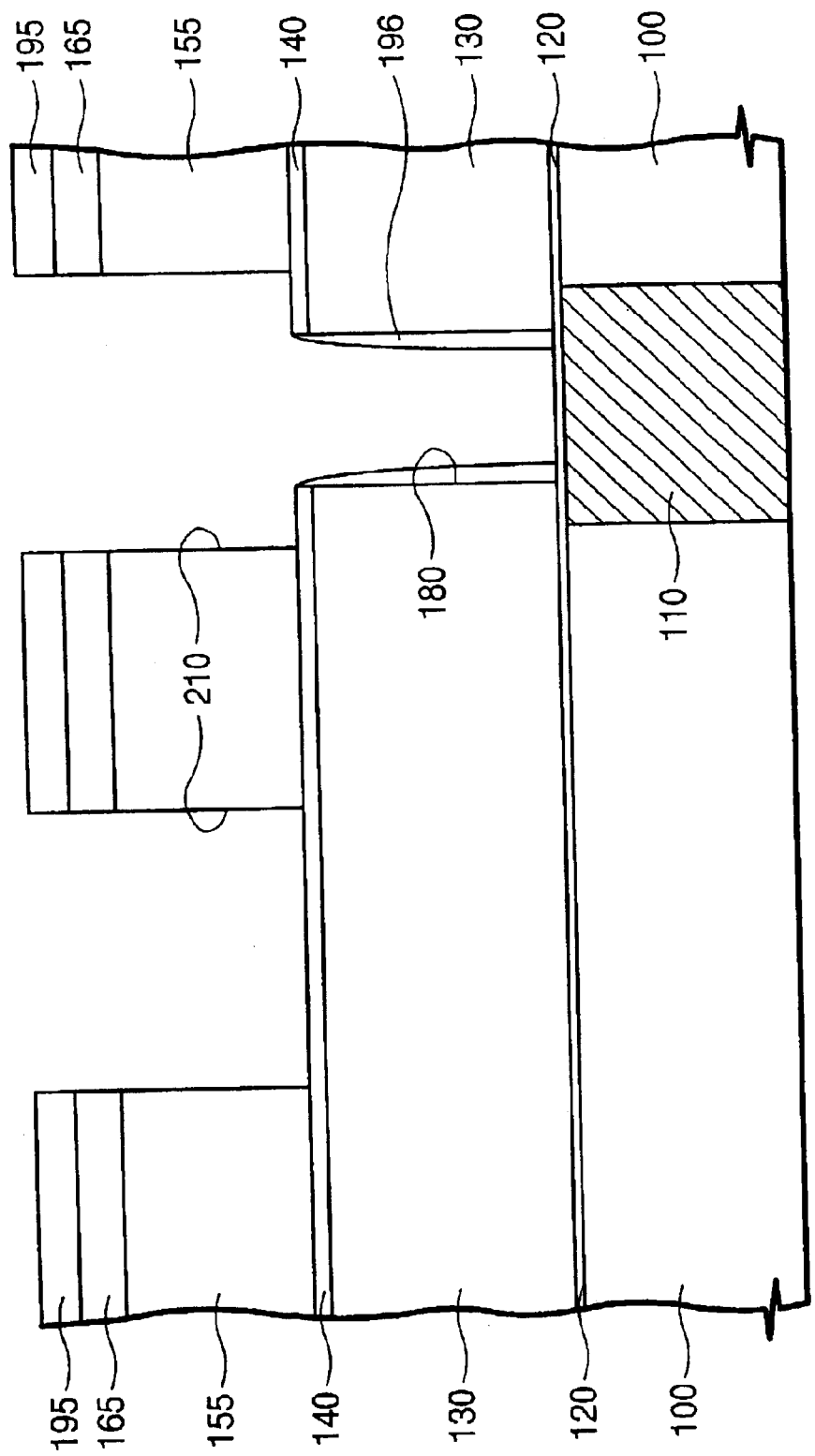

Referring to FIG. 3D, the upper capping layer 190, the lower capping layer 160, and the upper dielectric layer 150 are successively etched using the second photoresist pattern 200 as an etch mask. Thus, an upper dielectric pattern 155, a lower capping pattern 165, and an upper capping pattern 195, which have a trench line 210 exposing and crossing over the via hole 180 and are sequentially stacked on the upper etch stop layer 140, are formed. Here, the trench line 210 is formed under the opening pattern of the second photoresist pattern 200 as described in connection with FIG. 3C.

Meanwhile, as described above, the upper capping layer 190 is formed to have the poor step coverage. Thus, the upper capping layer 190 has the thicker thickness at the edges of the lower capping layer 160 and the upper dielectric layer 150 around the via hole 180, than at a lower region of the via hole 180. As a result, during the etching process for forming the trench line 210, the problem that the edges of the lower capping pattern 165 and the upper dielectric pattern 155 are rounded can be minimized.

Also, as the result of the etching process for forming the trench line 210, the upper capping layer 190 is removed from the upper region of the via hole 180 (i.e., the sidewalls of the lower capping pattern 165), which is thicker than the lower region of the via hole 180 (i.e., the sidewalls of the lower dielectric layer 130). Thus, even if the upper capping layer 190 has the poor step coverage, a problem that the width of the via hole becomes narrow is minimized. Due to the etching process for forming the trench line 210, an upper capping spacer 196 may be formed on the sidewalls of the lower dielectric layer 130. However, as the upper capping layer 190 covering the sidewalls of the lower dielectric layer 130 has the thin thickness due to the poor step coverage, it may be removed during the etching process for forming the trench line 210.

The second photoresist pattern 200 is removed to expose the upper side of the upper capping pattern 195.

Figure 3E:
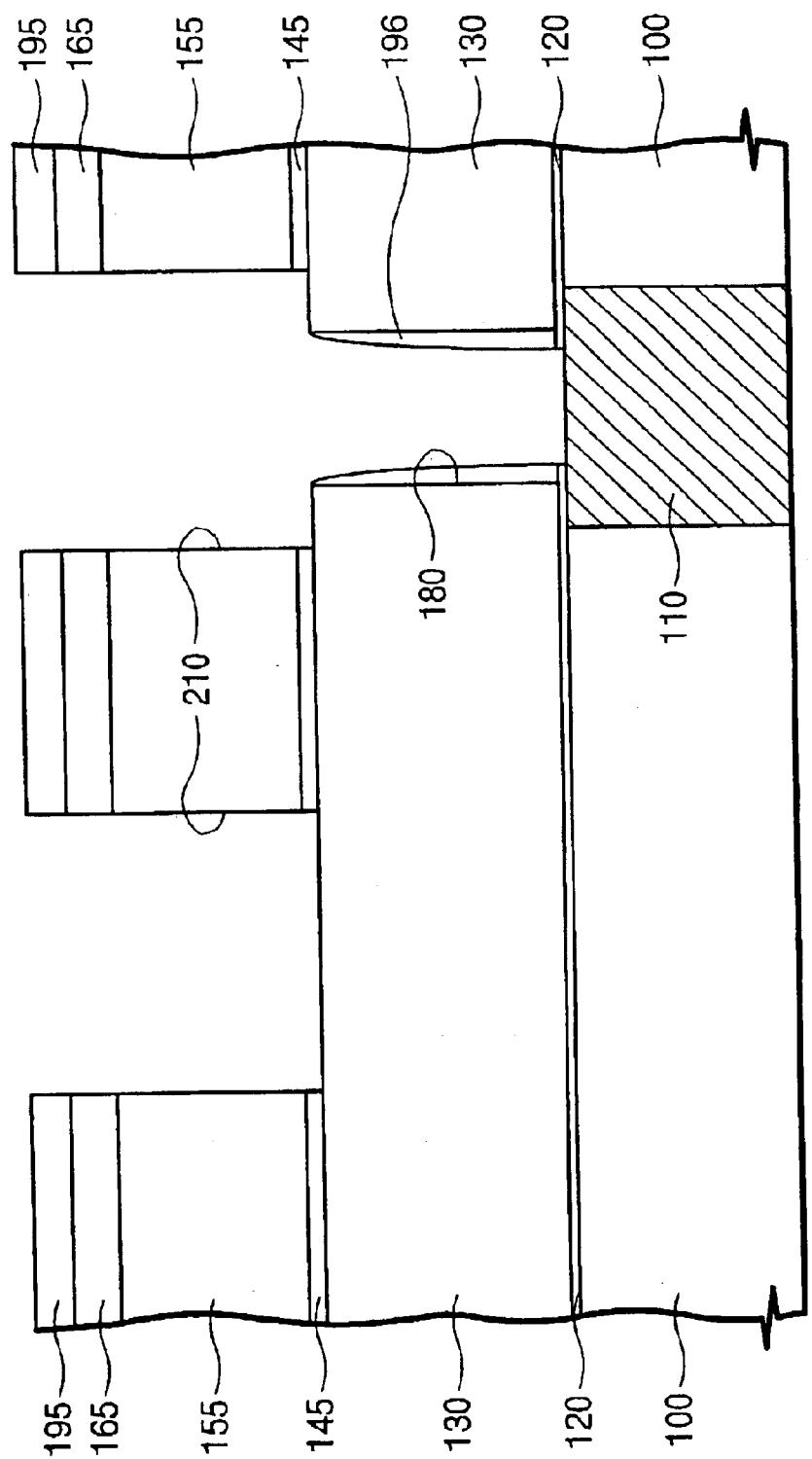

Referring to FIG. 3E, the upper etch stop pattern 145, which is exposed by the trench line 210, is removed using the exposed upper capping pattern 195 as an etch mask. Here, the lower etch stop layer 120, which is exposed by the via hole 180, is also etched to expose the upper side of the lower interconnection 110.

The etching process for removing the upper etch stop pattern 145 is preferably carried out using an etch recipe that can be selectively etched with respect to the lower interconnection 110 and the lower dielectric layer 130.

Figure 3F:
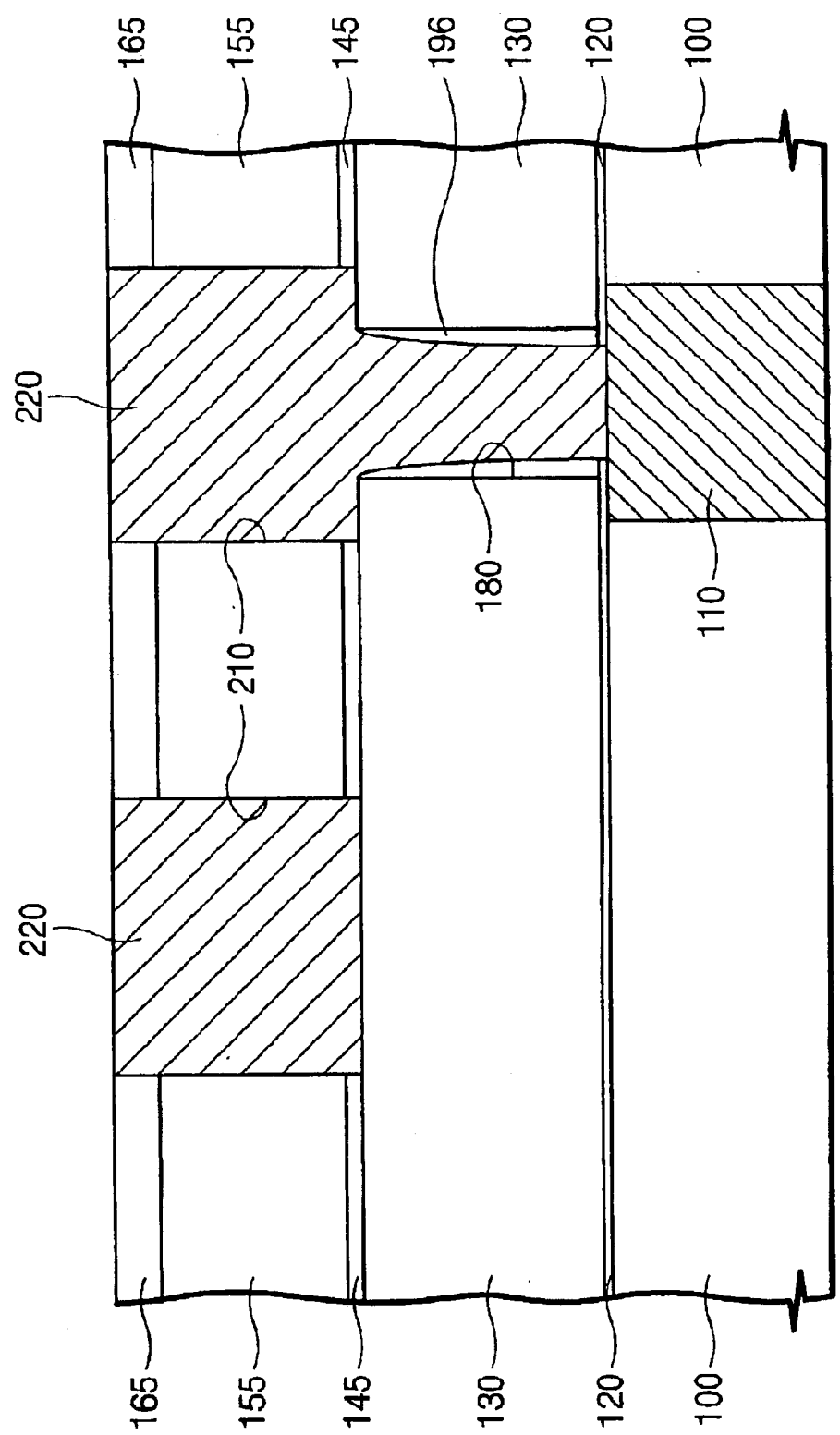

Referring to FIG. 3F, an upper metal layer (not shown) is formed on the entire surface of the semiconductor substrate where the lower interconnection 110 is exposed. The upper metal layer is preferably formed of copper using ordinary electroplating.

Thereafter, the upper metal layer is planarizedly etched to expose the upper side of the upper capping pattern 195, thereby forming an upper interconnection 220. The planarizing etch process for forming the upper interconnection 220 preferably adopts chemical mechanical polishing (CMP). At this time, to inhibit shorts between the adjacent upper interconnections 220, over-etching is applied to the planarizing etch process. As a result, the upper capping pattern 195 or the lower capping pattern 165 may be removed.

Meanwhile, according to the conventional method, the upper dielectric layer 150 is stacked in consideration of the recessed thickness caused by the over-etching during the planarizing etch process. But, the upper capping layer 190 serves as a buffer layer for the over-etching, instead of the upper dielectric layer 150 of the conventional planarizing etch process. Accordingly, according to the present invention, the upper dielectric layer 150 or the lower capping layer 160 may be formed as thin as the thickness to be over-etched.

In the conventional method, the via hole 40 penetrates the lower dielectric layer 25, the upper etch stop layer 30, and the upper dielectric layer 35. Thus, during the etching process for forming the via hole 40, the thickness of the material layer to be etched is quite thick. To etch such a thick material layer, a photoresist layer thicker than the material layer should be formed. This makes the photolithographic process difficult. By comparison, as described above, the present invention enables a reduction in the thickness of the upper dielectric layer 150 or the lower capping layer 160. As a result, it is capable of providing the photolithographic process for forming the via hole 180 with a sufficient process margin.

Figure 4:
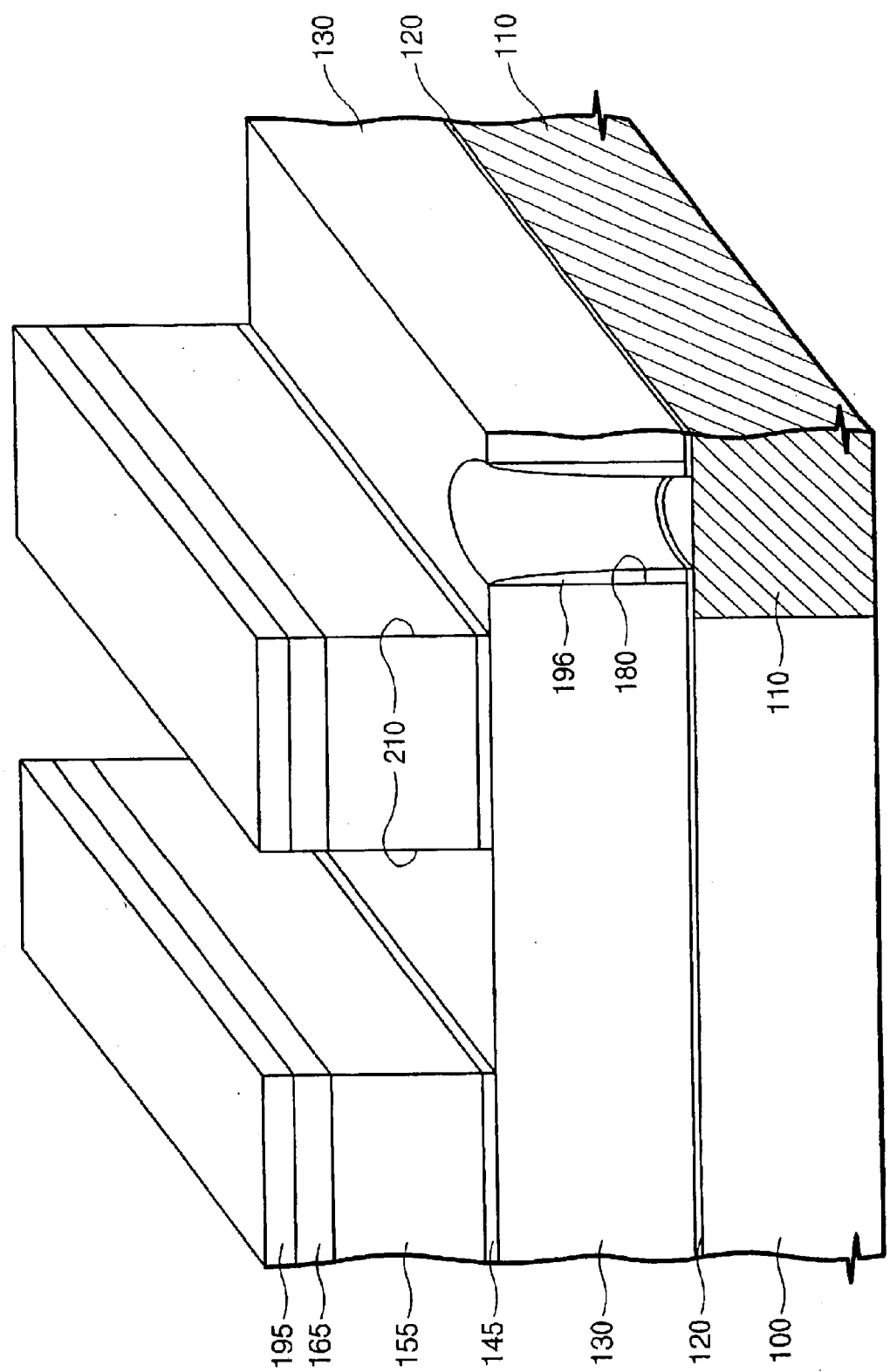
FIG. 4 is a perspective view illustrating the inter-metal dielectric pattern formed according to the preferred embodiments of the present invention.

FIG. 4 is a perspective view illustrating the inter-metal dielectric pattern formed according to the preferred embodiment of the present invention.

Referring to FIG. 4, a lower interconnection 110 is disposed on a semiconductor substrate. The lower interconnection 110 connects with each electrode of a transistor, a resistor, and a capacitor formed on the semiconductor substrate. The lower interconnection 110 is preferably formed of a material selected from the group consisting of metals such as copper and aluminum, or polysilicon.

A lower etch stop layer 120 and a lower dielectric layer 130, which have a via hole 180 exposing the predetermined upper side of the lower interconnection 110, are sequentially stacked on the lower interconnection 110.

An upper etch stop pattern 145, an upper dielectric pattern 155, and a lower capping pattern 165, which define a trench line 210, are sequentially stacked on the lower dielectric layer 130. The trench line 210 crosses over and exposes the via hole 180.

Meanwhile, an upper capping spacer may be further disposed on the inner wall of the via hole 180, i.e., the inner wall of the lower dielectric layer 130. Also, an upper capping pattern 195, which has the same width as that of the lower capping pattern 165, may be disposed on the lower capping pattern 165.

The lower etch stop layer 120 and the upper etch stop pattern 145 are formed of SiC layers.

Each of the lower dielectric layer 130 and the upper dielectric pattern 155 is formed of at least one material selected from the group consisting of $SiO_2$, SiOF, SiOC, SOG, and porous dielectric. The lower dielectric layer preferably has a thickness of 2000 Å to 5000 Å, while the upper dielectric pattern 155 preferably has a thickness of 2000 Å to 8000 Å.

The lower capping pattern 165, the upper capping pattern 195, and the upper capping spacer 196 are formed of a silicon oxide layer, a silicon carbide layer, a silicon nitride layer, a silicon oxynitride layer or a combination of the above. In particular, the upper capping spacer 196 is formed of the same material as the upper capping pattern 195. But, the lower and upper capping patterns 165 and 195 may not be formed of the identical material. The lower capping pattern 165 has a thickness of at least 200 Å, while the upper capping pattern 195 preferably has a thickness of 200 Å to 2000 Å.

According to the present invention, an upper capping layer is formed on a semiconductor substrate where a via hole is formed. Thus, the upper capping layer can prevent photoresist stacked for forming a trench line from abnormally reacting with a basic material included in an upper dielectric layer. As a result, photoresist residue does not remain, thus inhibiting shorts between interconnections formed on respectively different layers.

In addition, the upper capping layer is formed to have poor step coverage. Thus, the problem that the edge of the upper dielectric layer is rounded is minimized. Also, the upper capping layer is formed after forming the via hole, so as to reduce the thickness of the upper dielectric layer. Therefore, the photoresist layer for forming the via hole is reduced in thickness, thus enabling the stable photolithographic process.

What is claimed is:

1. A method of forming an inter-metal dielectric pattern, the method comprising:
    forming a lower interconnection on a semiconductor substrate;
    forming an inter-metal dielectric layer including a lower dielectric layer and an upper dielectric layer, which are sequentially stacked, on the surface of the semiconductor substrate including the lower interconnection;
    patterning the inter-metal dielectric layer to form a via hole exposing the upper side of the lower interconnection;
    forming an upper capping layer on the entire surface of the semiconductor substrate including the via hole; and
    successively patterning the upper capping layer and the upper dielectric layer to form a trench line exposing the upper side of the via hole.

2. The method as claimed in claim 1, wherein the lower dielectric layer is formed of at least one material selected from the group consisting of SiO$_2$, SiOF, SiOC, SOG, and porous dielectric.

3. The method as claimed in claim 1, wherein the upper dielectric layer is formed of at least one material selected from the group consisting of SiO$_2$, SiOF, SiOC, SOG, and porous dielectric.

4. The method as claimed in claim 1, wherein the upper capping layer is formed of at least one material selected from the group consisting of a silicon oxide layer, a silicon carbide layer, a silicon nitride layer, and a silicon oxynitride layer.

5. The method as claimed in claim 1, wherein the upper capping layer is preferably formed using at least one of plasma enhanced chemical vapor deposition, high-density plasma, and atomic layer deposition.

6. The method as claimed in claim 1, wherein forming the inter-metal dielectric layer further comprises forming a lower capping layer on the upper dielectric layer.

7. The method as claimed in claim 6, wherein the lower capping layer is formed of at least one material selected from the group consisting of a silicon oxide layer, a silicon carbide layer, a silicon nitride layer, and a silicon oxynitride layer.

8. The method as claimed in claim 1, wherein forming the via hole is performed by an anisotropic etching process using an etch recipe which can selectively etch the lower interconnection.

9. The method as claimed in claim 1, wherein forming the trench line comprises:
    forming a photoresist layer on the upper capping layer;
    applying a photolithographic process to the photoresist layer to form a photoresist pattern;
    successively etching the upper capping layer and the upper dielectric layer using the photoresist pattern as an etch mask, to form an upper capping pattern and an upper dielectric pattern; and
    removing the photoresist pattern,
    wherein the photolithographic process comprises an exposure process using ultraviolet rays, and the etching process for forming the upper dielectric pattern comprises forming an upper capping spacer on an inner wall of the via hole surrounded by the lower dielectric layer.

10. The method as claimed in claim 1, wherein forming an inter-metal dielectric comprises forming a lower etch stop layer covering the lower interconnection before forming the lower dielectric layer.

11. The method as claimed in claim 10, wherein the lower etch stop layer is formed of a silicon carbide layer.

12. The method as claimed in claim 10, wherein forming the via hole comprises etching the inter-metal dielectric layer using an etch recipe which can be selectively etched with respect to the lower etch stop layer.

13. The method as claimed in claim 10, wherein forming the trench line comprises:
    successively etching the upper capping pattern and the upper dielectric layer using an etch recipe which can be selectively etched with respect to the lower etch stop layer; and
    etching the lower etch stop layer using an etch recipe which can be selectively etched with respect to the lower interconnection.

14. The method as claimed in claim 1, wherein forming the inter-metal dielectric layer further comprises forming an upper etch stop layer on the lower dielectric layer, before forming the upper dielectric layer.

15. The method as claimed in claim 14, wherein the upper etch stop layer is formed of a silicon carbide layer.

16. An inter-metal dielectric pattern, comprising:
    a lower interconnection disposed on a semiconductor substrate;
    a lower dielectric layer having a via hole exposing the lower interconnection and covering the semiconductor substrate where the lower interconnection is disposed;
    an upper dielectric pattern and a lower capping pattern, which include a trench line exposing the via hole and which are sequentially stacked on the lower dielectric layer; and
    a lower etch stop layer formed of a silicon carbide layer, disposed between the lower dielectric layer and the lower interconnection.

17. The inter-metal dielectric pattern as claimed in claim 16, wherein the lower dielectric layer is formed of at least one material selected from the group consisting of SiO$_2$, SiOF, SiOC, SOG, and porous dielectric.

18. The inter-metal dielectric pattern as claimed in claim 16, wherein the upper dielectric pattern is formed of at least one material selected from the group consisting of SiO$_2$, SiOF, SiOC, SOG, and porous dielectric.

19. The inter-metal dielectric pattern as claimed in claim 16, wherein the lower capping pattern is formed of at least one material selected from the group consisting of a silicon oxide layer, a silicon carbide layer, a silicon nitride layer, and a silicon oxynitride layer.

20. The inter-metal dielectric pattern as claimed in claim 16, further comprising an upper capping spacer disposed on an inner wall of the via hole.

21. The inter-metal dielectric pattern as claimed in claim 20, wherein the upper capping spacer is formed of at least one material selected from the group consisting of a silicon oxide layer, a silicon carbide layer, a silicon nitride layer, and a silicon oxynitride layer.

22. The inter-metal dielectric pattern as claimed in claim 16, further comprising a lower etch stop layer formed of a silicon carbide layer, disposed between the upper dielectric pattern and the lower dielectric a layer.

23. An inter-metal dielectric pattern, comprising:
- a lower interconnection disposed on a semiconductor substrate;
- a lower dielectric layer having a via hole exposing the lower interconnection and covering the semiconductor substrate where the lower interconnection is disposed;
- an upper dielectric pattern and a lower capping pattern, which include a trench line exposing the via hole and which are sequentially stacked on the lower dielectric layer; and
- an upper etch stop pattern formed of a silicon carbide layer, disposed between the upper dielectric pattern and the lower dielectric layer.

24. The inter-metal dielectric pattern as claimed in claim 23, wherein the lower dielectric layer is formed of at least one material selected from the group consisting of $SiO_2$, SiOF, SiOC, SOG, and porous dielectric.

25. The inter-metal dielectric pattern as claimed in claim 23, wherein the upper dielectric pattern is formed of at least one material selected from the group consisting of $SiO_2$, SiOF, SiOC, SOG, and porous dielectric.

26. The inter-metal dielectric pattern as claimed in claim 23, wherein the lower capping pattern is formed of at least one material selected from the group consisting of a silicon oxide layer, a silicon carbide layer, a silicon nitride layer, and a silicon oxynitride layer.

27. The inter-metal dielectric pattern as claimed in claim 23, further comprising an upper capping spacer disposed on an inner wall of the via hole.

28. The inter-metal dielectric pattern as claimed in claim 27, wherein the upper capping spacer is formed of at least one material selected from the group consisting of a silicon oxide layer, a silicon carbide layer, a silicon nitride layer, and a silicon oxynitride layer.

* * * * *